(12) United States Patent
Huang et al.

(10) Patent No.: US 12,068,193 B2
(45) Date of Patent: Aug. 20, 2024

(54) SEMICONDUCTOR DEVICE STRUCTURE WITH INTERCONNECT STRUCTURE HAVING AIR GAP

(71) Applicant: Taiwan Semiconductor Manufacturing Company, Ltd., Hsinchu (TW)

(72) Inventors: Hsin-Yen Huang, New Taipei (TW); Ting-Ya Lo, Hsinchu (TW); Shao-Kuan Lee, Kaohsiung (TW); Chi-Lin Teng, Taichung (TW); Shau-Lin Shue, Hsinchu (TW); Hsiao-Kang Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 210 days.

(21) Appl. No.: 17/377,822

(22) Filed: Jul. 16, 2021

(65) Prior Publication Data

US 2023/0016154 A1    Jan. 19, 2023

(51) Int. Cl.

| | |
|---|---|
| *H01L 21/768* | (2006.01) |
| *H01L 23/532* | (2006.01) |
| *H01L 29/06* | (2006.01) |
| *H01L 29/423* | (2006.01) |
| *H01L 29/78* | (2006.01) |
| *H01L 29/786* | (2006.01) |

(52) U.S. Cl.
CPC ...... *H01L 21/7682* (2013.01); *H01L 21/7685* (2013.01); *H01L 21/76877* (2013.01); *H01L 23/5329* (2013.01); *H01L 29/0665* (2013.01); *H01L 29/42392* (2013.01); *H01L 29/785* (2013.01); *H01L 29/78696* (2013.01)

(58) Field of Classification Search
CPC .......... H01L 21/7682; H01L 21/76802; H01L 29/42392; H01L 29/785; H01L 29/0665; H01L 29/0649; H01L 29/4991; H01L 21/7685; H01L 21/76877; H01L 23/5329; H01L 29/78696; H01L 21/76849
See application file for complete search history.

(56) References Cited

U.S. PATENT DOCUMENTS

| | | | | |
|---|---|---|---|---|
| 10,128,334 | B1* | 11/2018 | Bourjot | H01L 29/6659 |
| 2015/0004782 | A1* | 1/2015 | Oshida | H01L 23/53295 |
| | | | | 438/641 |
| 2015/0262860 | A1* | 9/2015 | Kao | H01L 23/53295 |
| | | | | 438/653 |
| 2018/0261494 | A1* | 9/2018 | Cheng | H01L 23/53295 |

* cited by examiner

*Primary Examiner* — Changhyun Yi
(74) *Attorney, Agent, or Firm* — Birch, Stewart, Kolasch & Birch, LLP

(57) ABSTRACT

A semiconductor device structure and method for forming the same are provided. The semiconductor device structure includes a first conductive layer formed over a substrate, and an air gap structure adjacent to the first conductive layer. The semiconductor device structure includes a support layer formed over the air gap structure. A bottom surface of the support layer is in direct contact with the air gap structure, and the bottom surface of the support layer is lower than a top surface of the first conductive layer and higher than a bottom surface of the first conductive layer.

20 Claims, 17 Drawing Sheets

SEMICONDUCTOR DEVICE STRUCTURE WITH INTERCONNECT STRUCTURE HAVING AIR GAP

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of semiconductor devices has been continuously reduced in order to increase device density. Accordingly, a multi-layered interconnect structure is provided. The interconnect structure may include one or more conductive lines and via layers.

Although existing interconnect structures and methods of fabricating interconnect structures have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
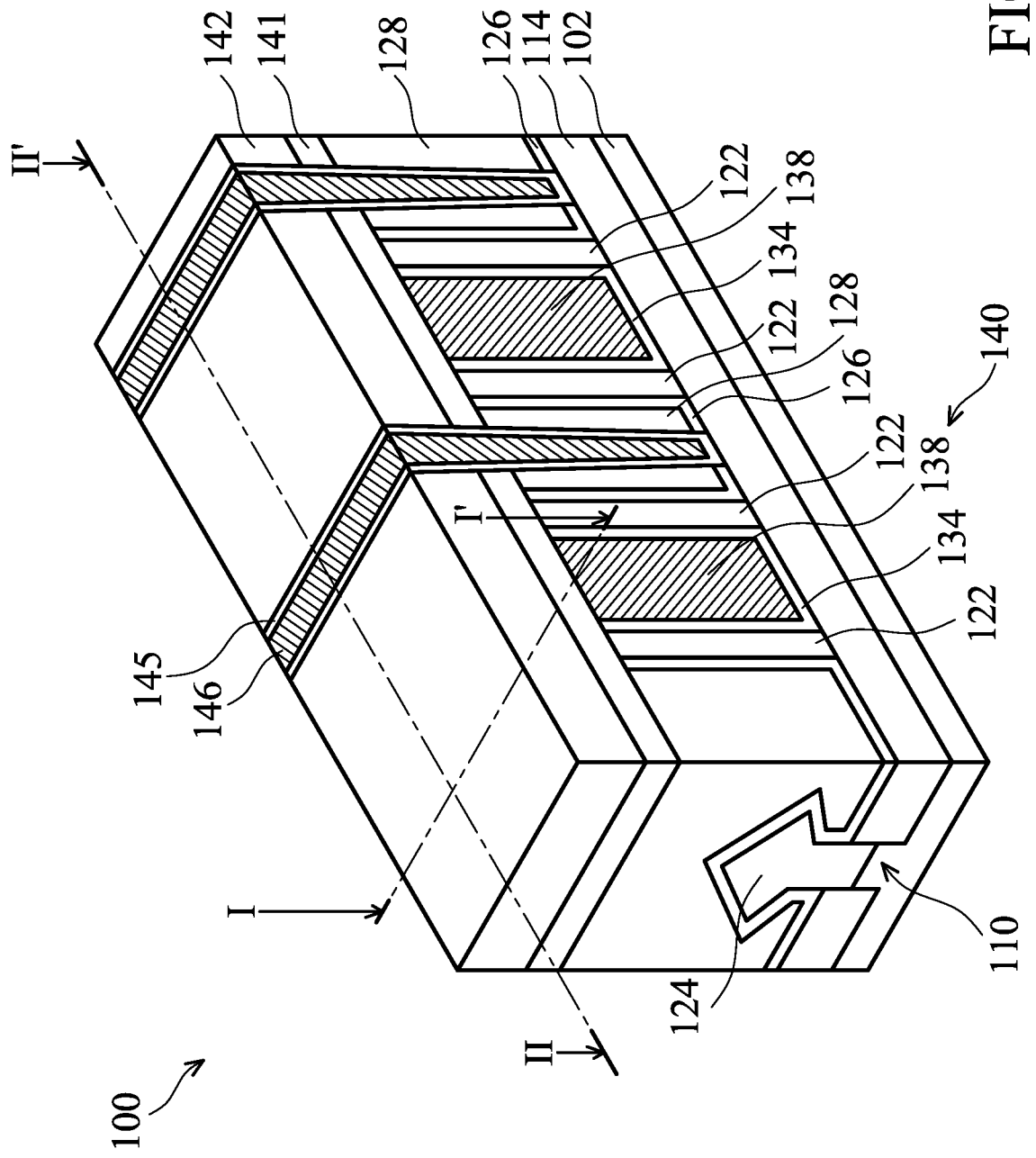
FIG. 1A shows a three-dimensional view of a semiconductor device structure 100, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor device structure with an interconnect structure are provided. The interconnect structure includes a number of metallization layers formed in a dielectric layer (such as inter-metal dielectric, IMD). The semiconductor device structure having air gap structure can minimize a dielectric constant of the interconnect structure, therefore reducing the parasitic capacitance between the conductive layers in the interconnect structure.

Figure 1B:
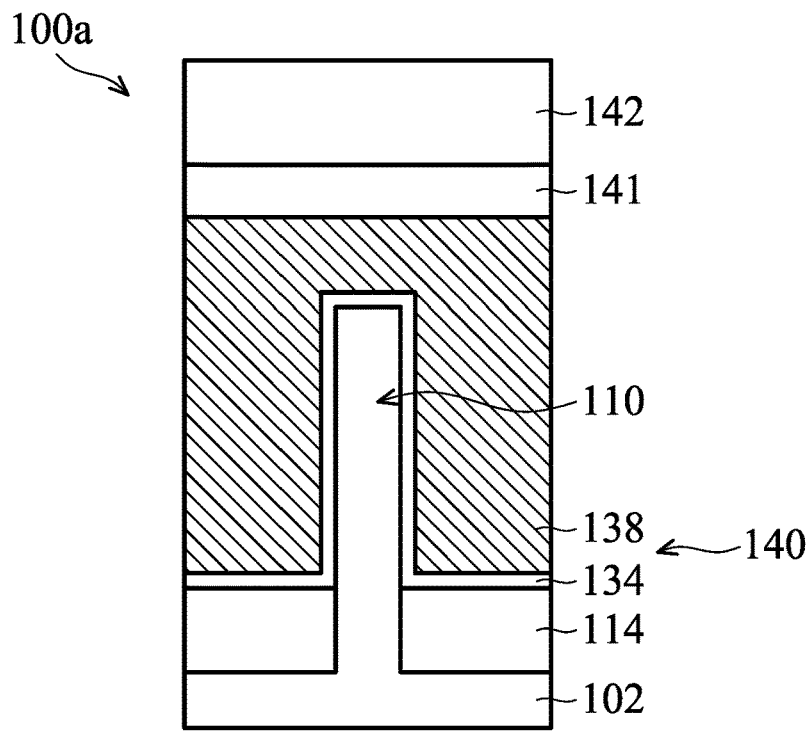
FIG. 1B shows a cross-sectional representation taken along line I-I' of FIG. 1A, in accordance with some embodiments of the disclosure.
Figure 1C:
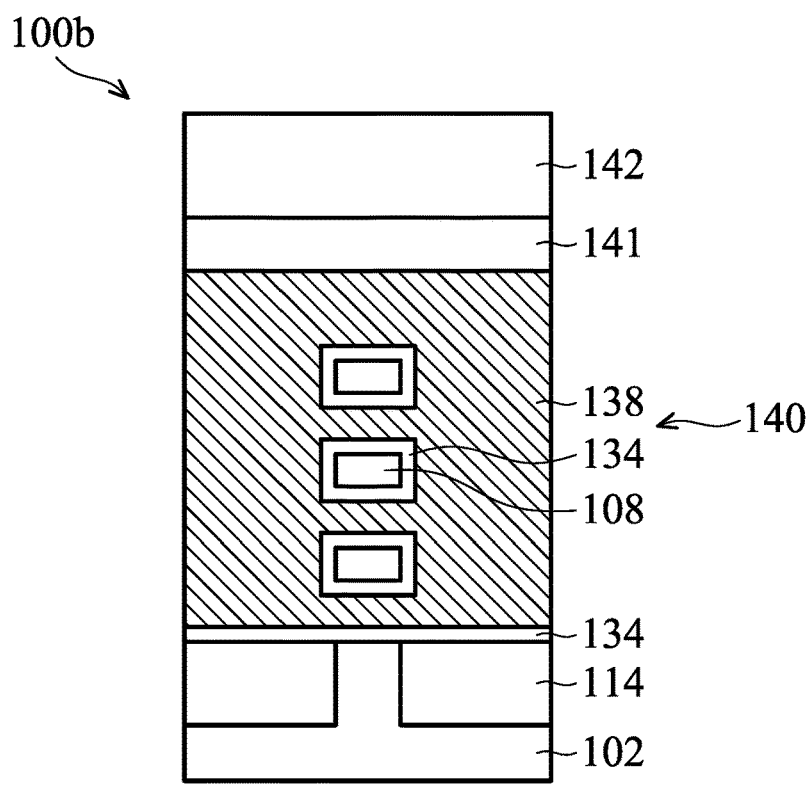
FIG. 1C shows a cross-sectional representation taken along line I-I' of FIG. 1A, in accordance with some embodiments of the disclosure.

FIG. 1A shows a three-dimensional view of a semiconductor device structure 100, in accordance with some embodiments of the disclosure. The semiconductor device structure 100 may be a fin field effect transistor (FinFET) device structure 100a or a gate all around (GAA) transistor structure 100b. FIG. 1B shows a cross-sectional representation taken along line I-I' of FIG. 1A, in accordance with some embodiments of the disclosure. FIG. 1B shows a fin field effect transistor (FinFET) device structure 100a. FIG. 1C shows a cross-sectional representation taken along line I-I' of FIG. 1A, in accordance with some embodiments of the disclosure. FIG. 1C shows a gate all around (GAA) transistor structure 100b.

In some embodiments, as shown in FIG. 1B, the fin field effect transistor (FinFET) structure 100a includes one or more fin structures 110 (e.g., Si fins) that extend from the substrate 102. The fin structure 110 may optionally include germanium (Ge). The fin structure 110 may be formed by using suitable processes such as photolithography and etching processes. In some embodiments, the fin structure 110 is etched from the substrate 102 using dry etch or plasma processes.

In some embodiments, as shown in FIG. 1C, the gate all around (GAA) transistor structure 100b includes a number of nanostructures 108 stacked in a vertical direction. The nanostructures 108 are spaced from each other. The nanostructures 108 may be referred to as "nanostructures", "nanowires", or "nanosheets". In some embodiments, the nanostructures 108 include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material.

As shown in FIG. 1A, the semiconductor device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements (not shown) are formed in the substrate 102. Device elements include transistors (e.g., metal oxide semiconductor field effect transistors (MOS-FET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

An isolation structure 114, such as a shallow trench isolation (STI) structure, is formed to surround the fin structure 110. In some embodiments, a lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

The semiconductor device structure 100 further includes a gate structure 140 including a gate dielectric layer 134 and a gate electrode layer 138. The gate structure 140 is formed over a central portion of the fin structure 110 or the nano-structures 108. In some other embodiments, the gate structure 140 is a dummy gate stack and is replaced later by a metal gate (MG) after high thermal budget processes are performed.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials. The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, the gate structure 140 further includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

As shown in FIG. 1A, gate spacer layers 122 are formed on the opposite sidewalls of the gate structure 140. The gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$)

The source/drain (S/D) structures 124 are formed adjacent to the gate structure 140. In some embodiments, portions of the fin structure 110 adjacent to the dummy gate structure (not shown) are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

As shown in FIG. 1A, a contact etch stop layer (CESL) 126 is formed over the substrate 102, and an inter-layer dielectric (ILD) layer 128 is formed over the CESL 126, in accordance with some embodiments. In some other embodiments, the CESL 126 is made of silicon nitride, silicon oxynitride, and/or other applicable materials. The CESL 126 may be formed by plasma enhanced CVD, low-pressure CVD, ALD, or other applicable processes.

The ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 128 may be formed by chemical vapor deposition (CVD), physical vapor deposition, (PVD), atomic layer deposition (ALD), spin-on coating, or another applicable process.

As shown in FIG. 1A, an etch stop layer 141 is formed over the gate structure 140 and over the ILD layer 128, and a dielectric layer 142 is formed over the etch stop layer 141. The etch stop layer 141 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the etch stop layer 141 is formed by performing a deposition process, such as an atomic layer deposition (ALD) process, a chemical vapor deposition (CVD) process, a physical vapor deposition (PVD) process, or another applicable process.

The dielectric layer 142 may be a single layer or multiple layers. The dielectric layer 142 is made of silicon oxide (SiOx), silicon nitride (SixNy), silicon oxynitride (SiON), dielectric material(s) with low dielectric constant (low-k), or combinations thereof. In some embodiments, the dielectric layer 142 is formed by performing a deposition process, such as an atomic layer deposition (ALD) process, a chemical vapor deposition (CVD) process, a physical vapor deposition (PVD) process, or another applicable process.

As shown in FIG. 1A, a barrier layer 145 and an S/D contact structure 146 is formed over the S/D contact structure 146, in accordance with some embodiments. In addition, a metal silicide layer 143 is formed on the S/D structure 124, and the S/D contact structure 146 is formed on the metal silicide layer 143. More specifically, the metal silicide layer 143 is between the S/D structure 124 and the S/D contact structure 146. The metal silicide layer 143 is used to reduce contact resistance (Rcsd) between the S/D contact structure 146 and the S/D structure 124.

In some embodiments, the barrier layer 145 includes tantalum (Ta), tantalum nitride (TaN), titanium (Ti), titanium nitride (TiN), cobalt tungsten (CoW) or another applicable material. In some embodiments, the barrier layer 145 is formed by a deposition process, such as a chemical vapor deposition (CVD) process, a sputtering process, or another applicable process. In some embodiments, the S/D contact structure 146 includes copper (Cu), tungsten (W), cobalt (Co), or another applicable material. In some embodiments, the S/D contact structure 146 is formed by a deposition process, such as a chemical vapor deposition (CVD) process, a sputtering process, or another applicable process.

Figure 2A:
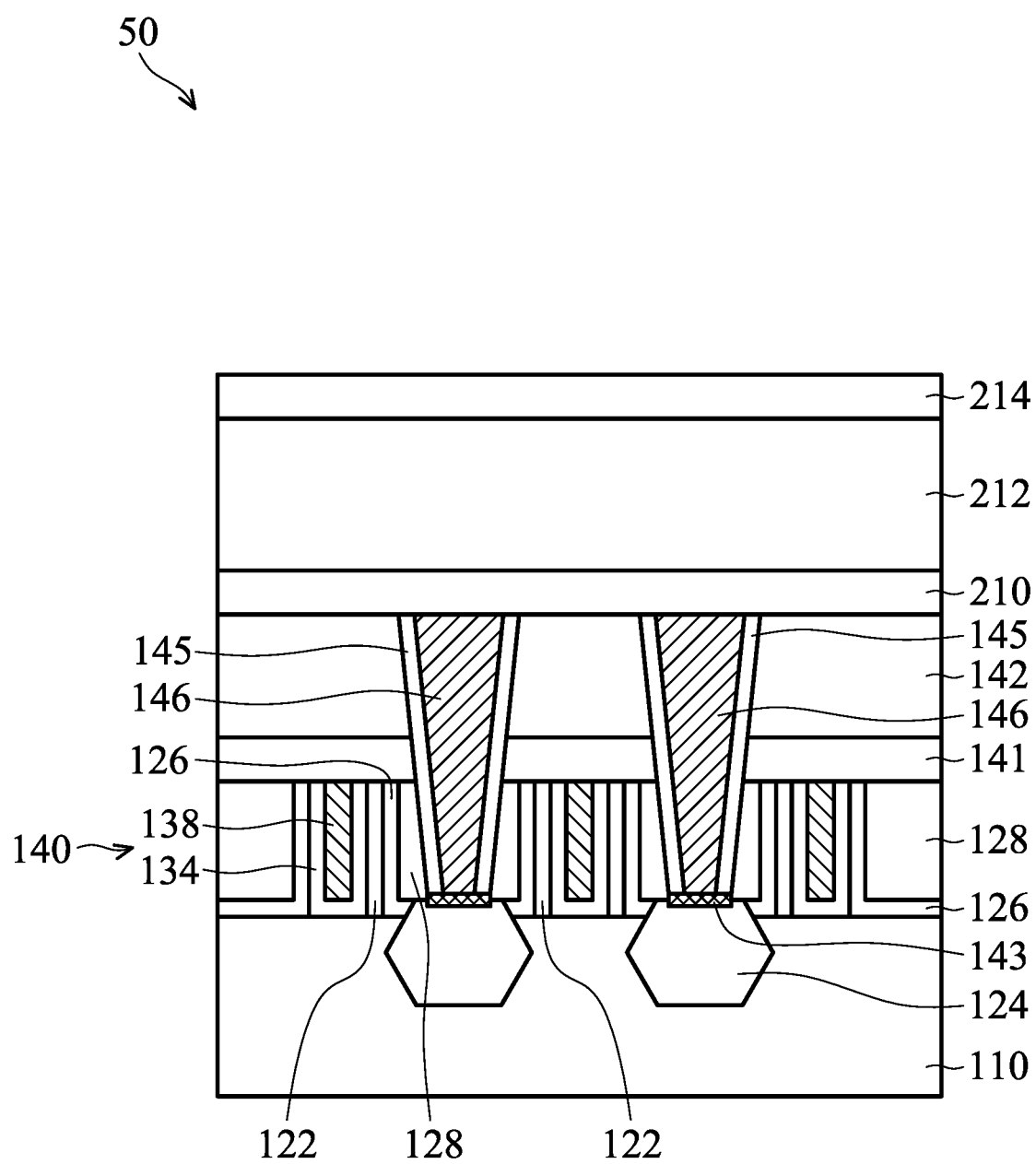
FIGS. 2A-2O show cross-sectional representations of various stages of forming a semiconductor device structure after FIG. 1A, in accordance with some embodiments of the disclosure.
Figure 2B:
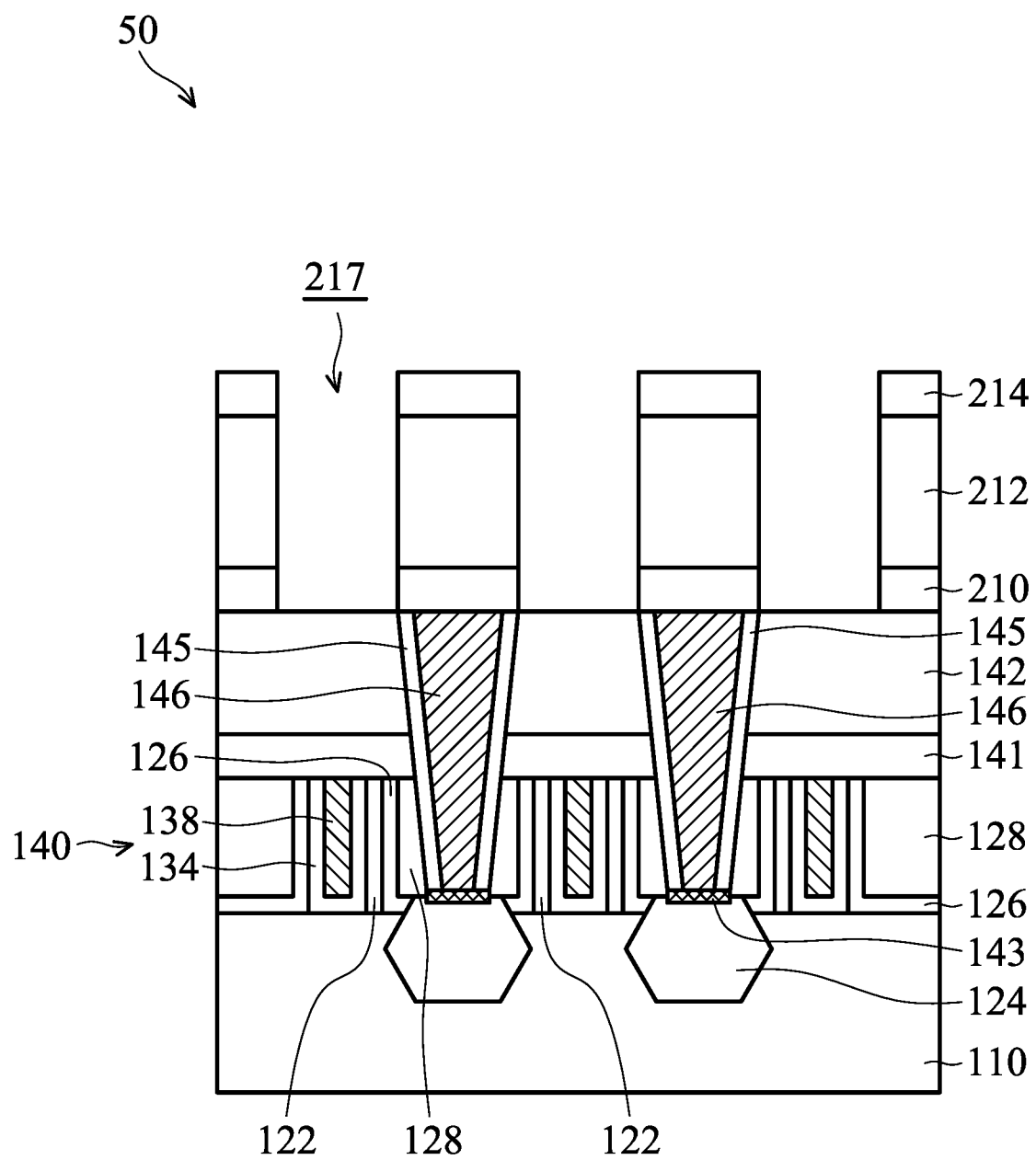
Figure 2C:
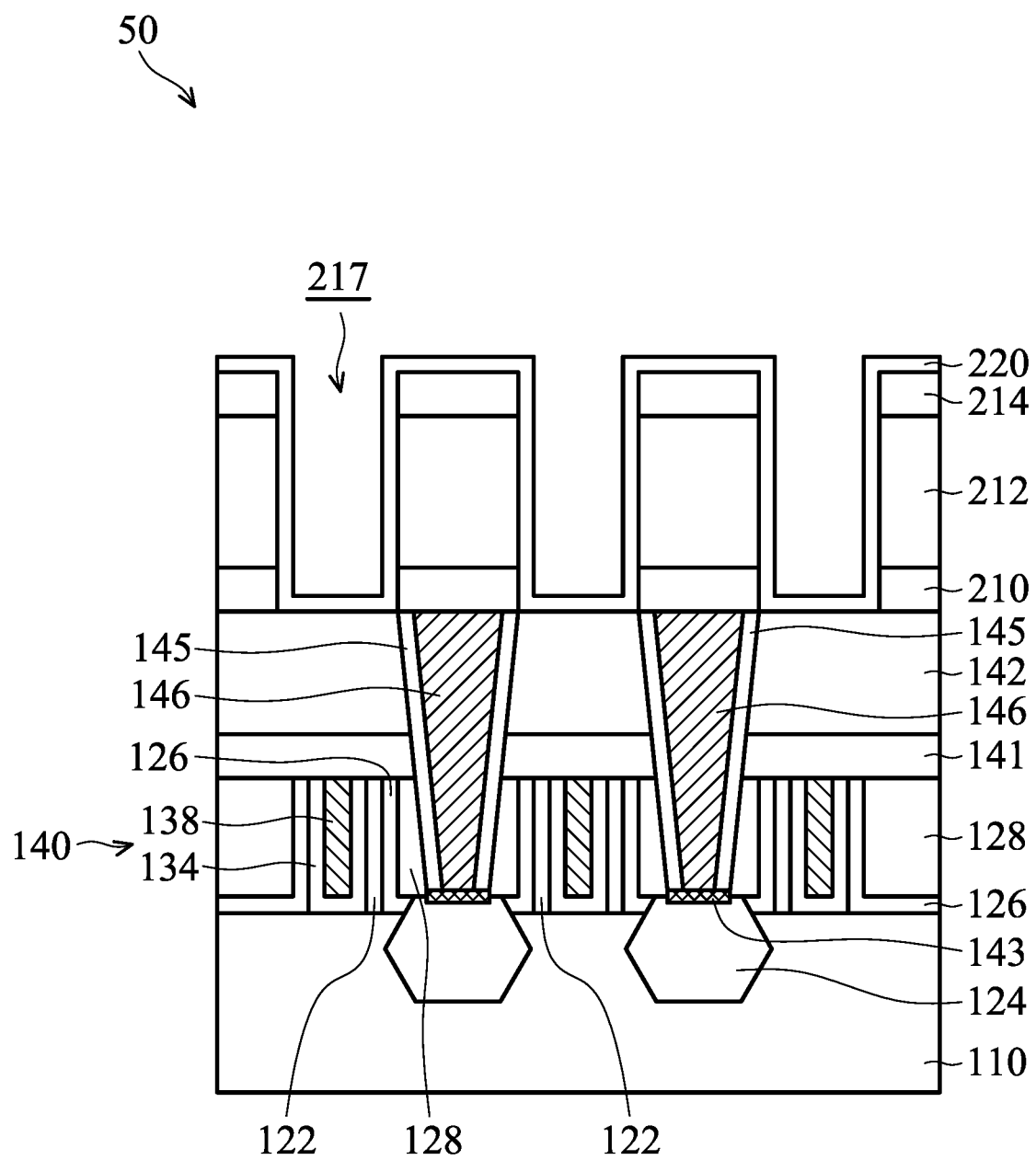
Figure 2D:
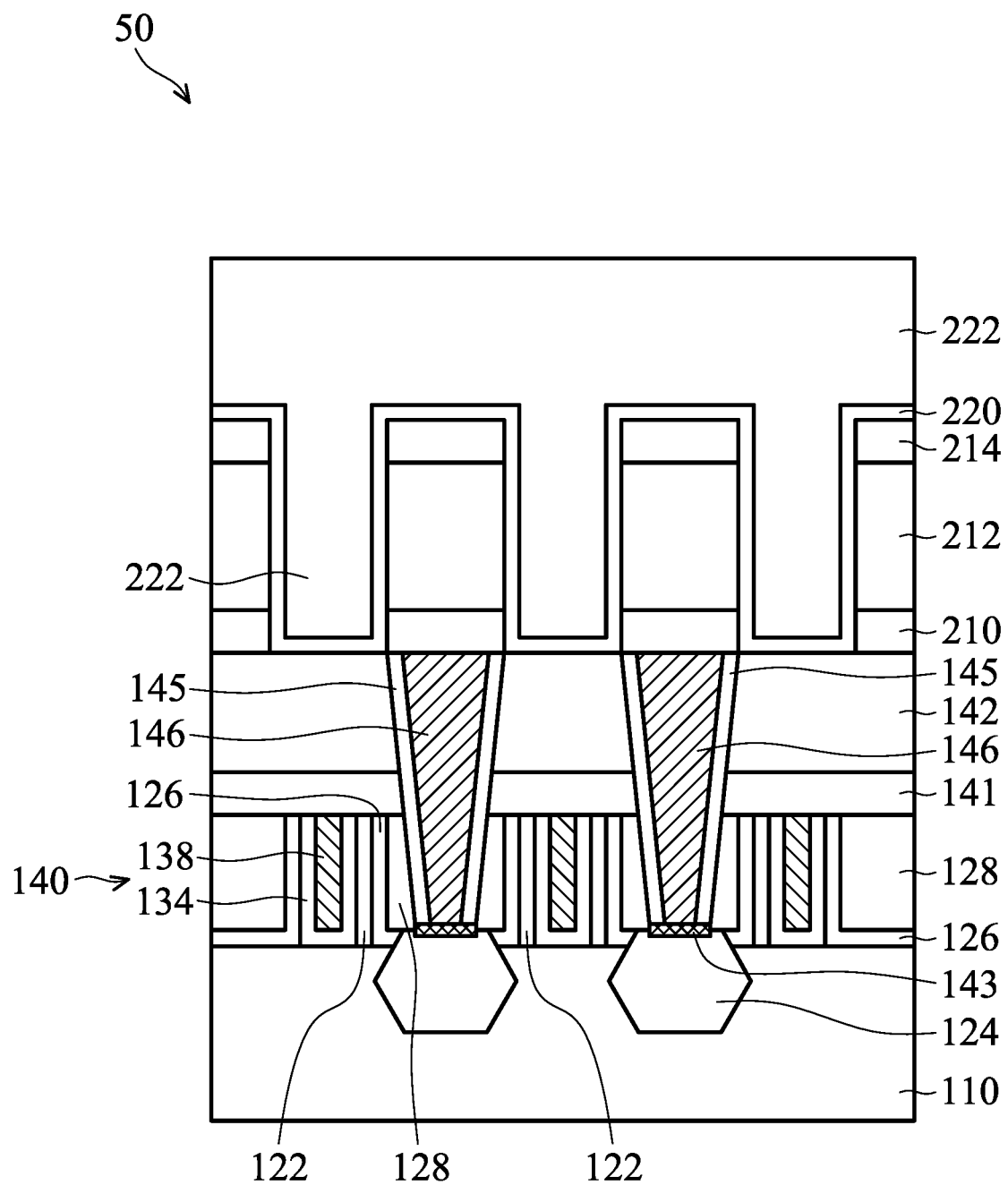
Figure 2E:
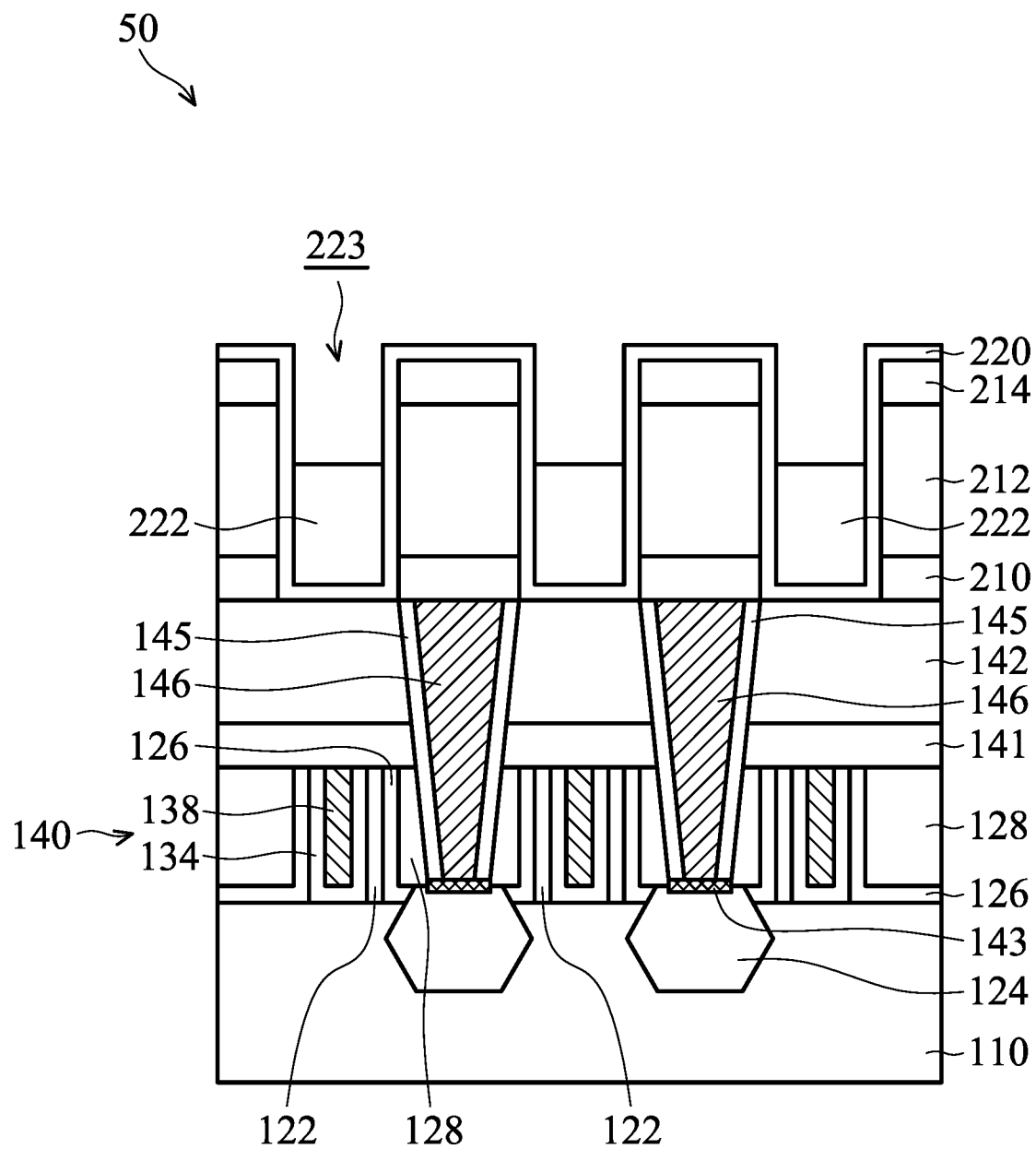
Figure 2F:
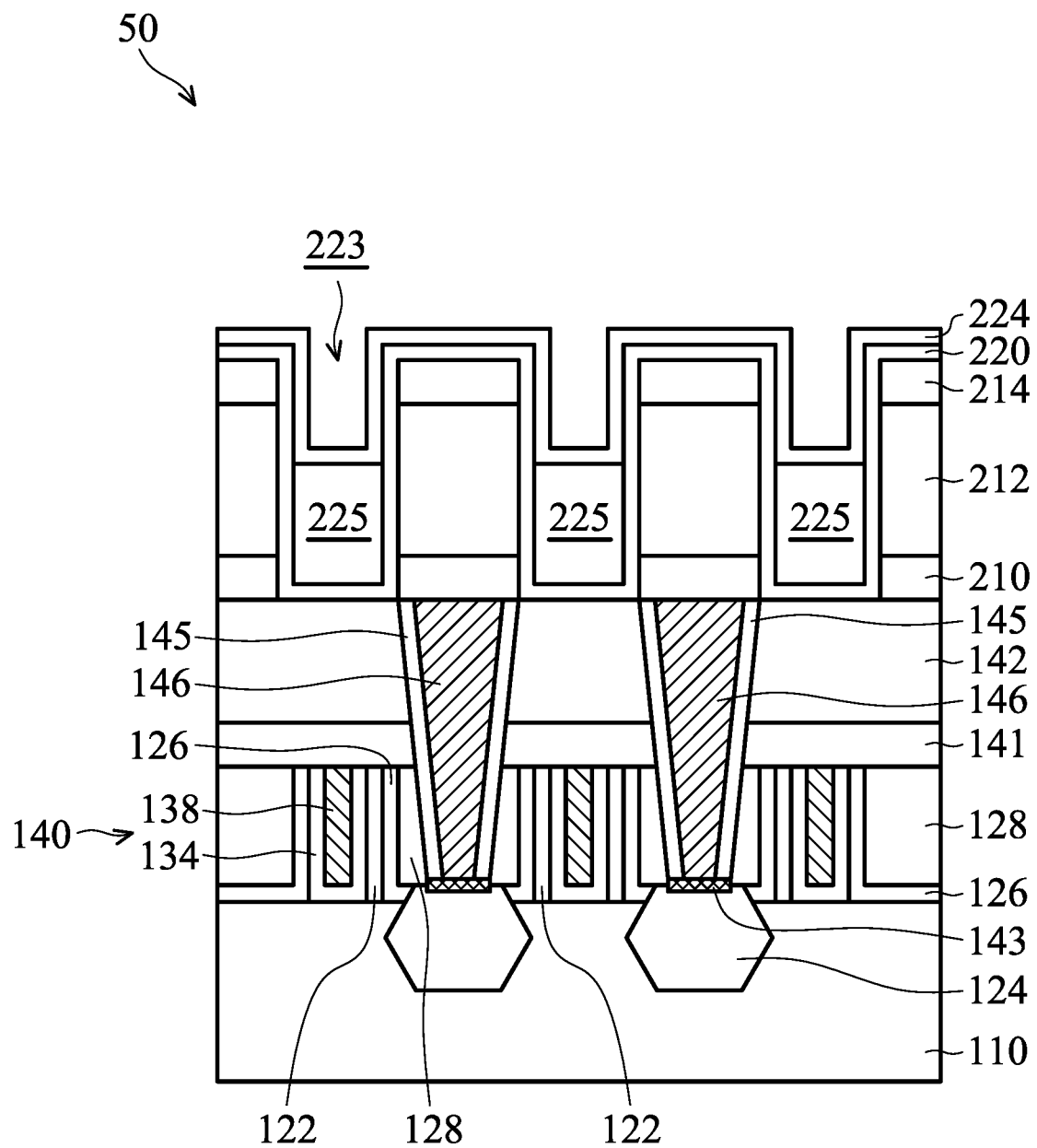
Figure 2G:
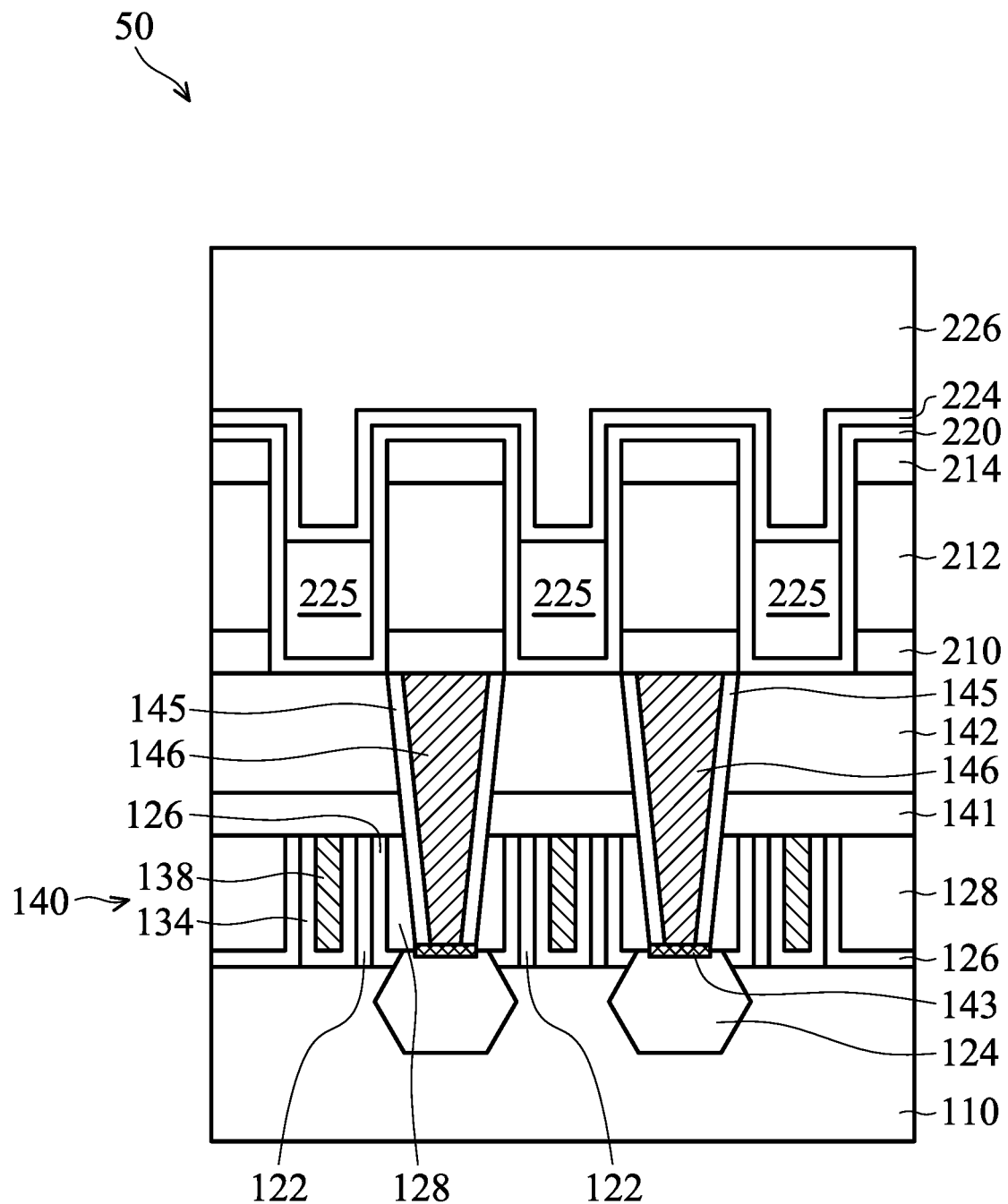
Figure 2H:
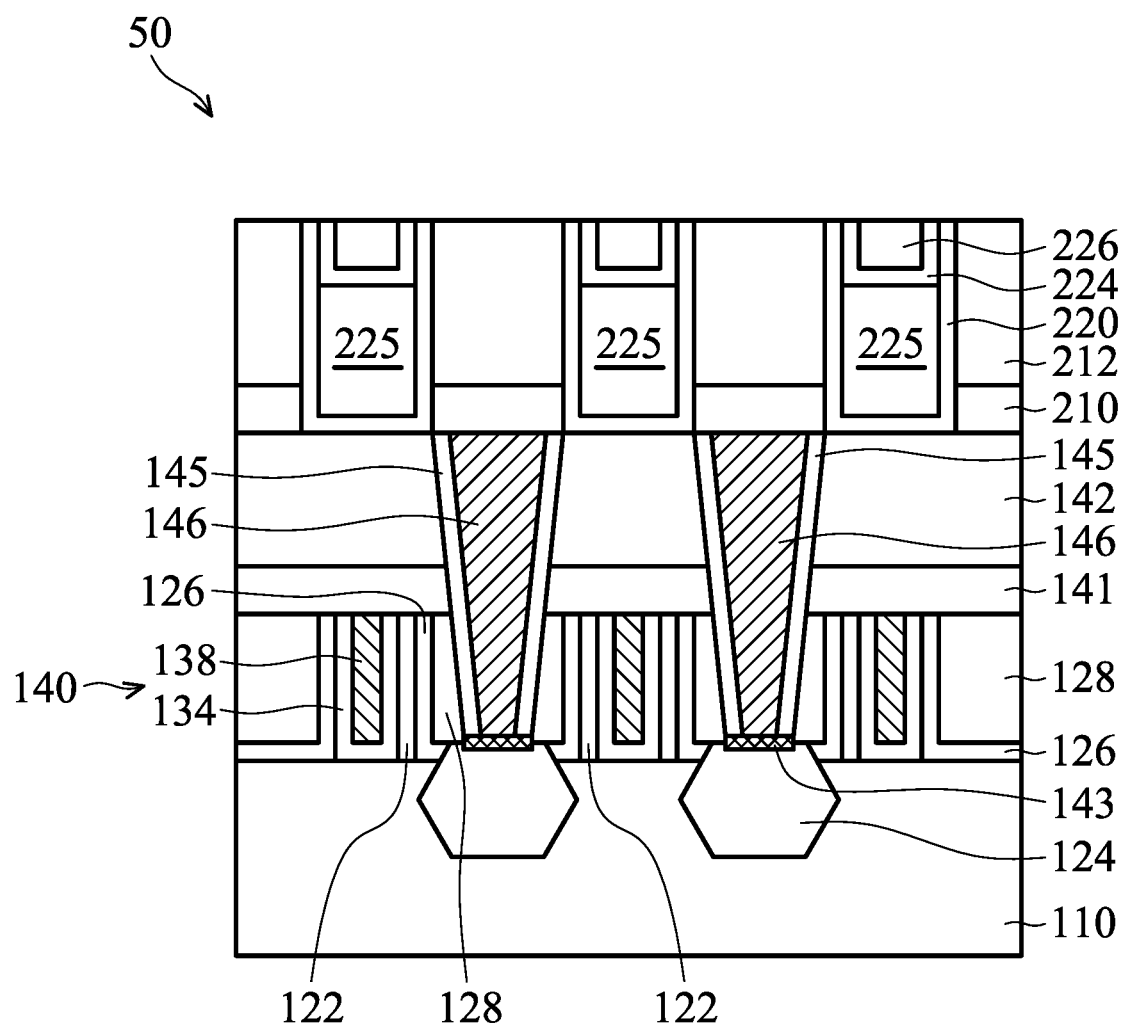
Figure 2I:
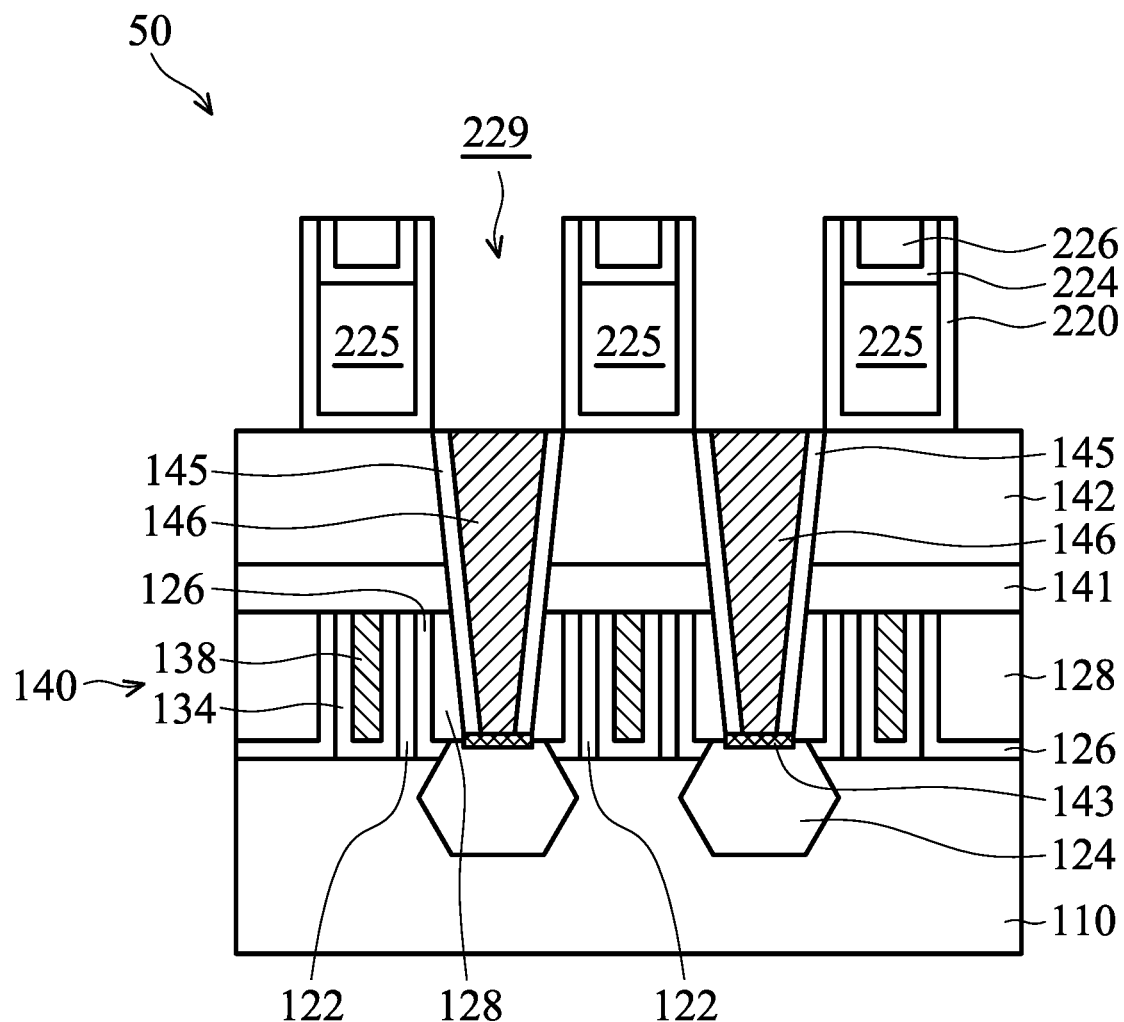
Figure 2J:
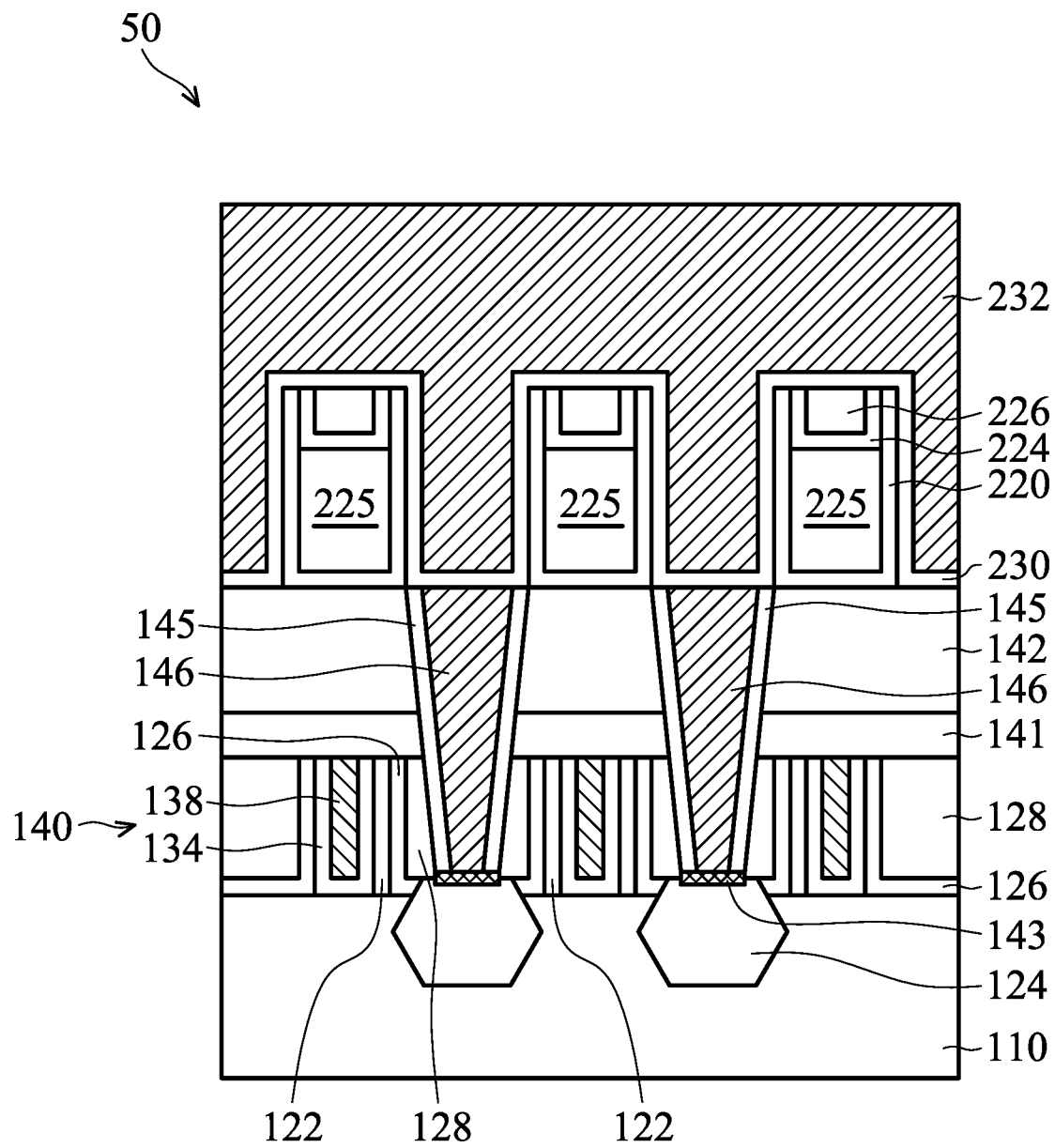
Figure 2K:
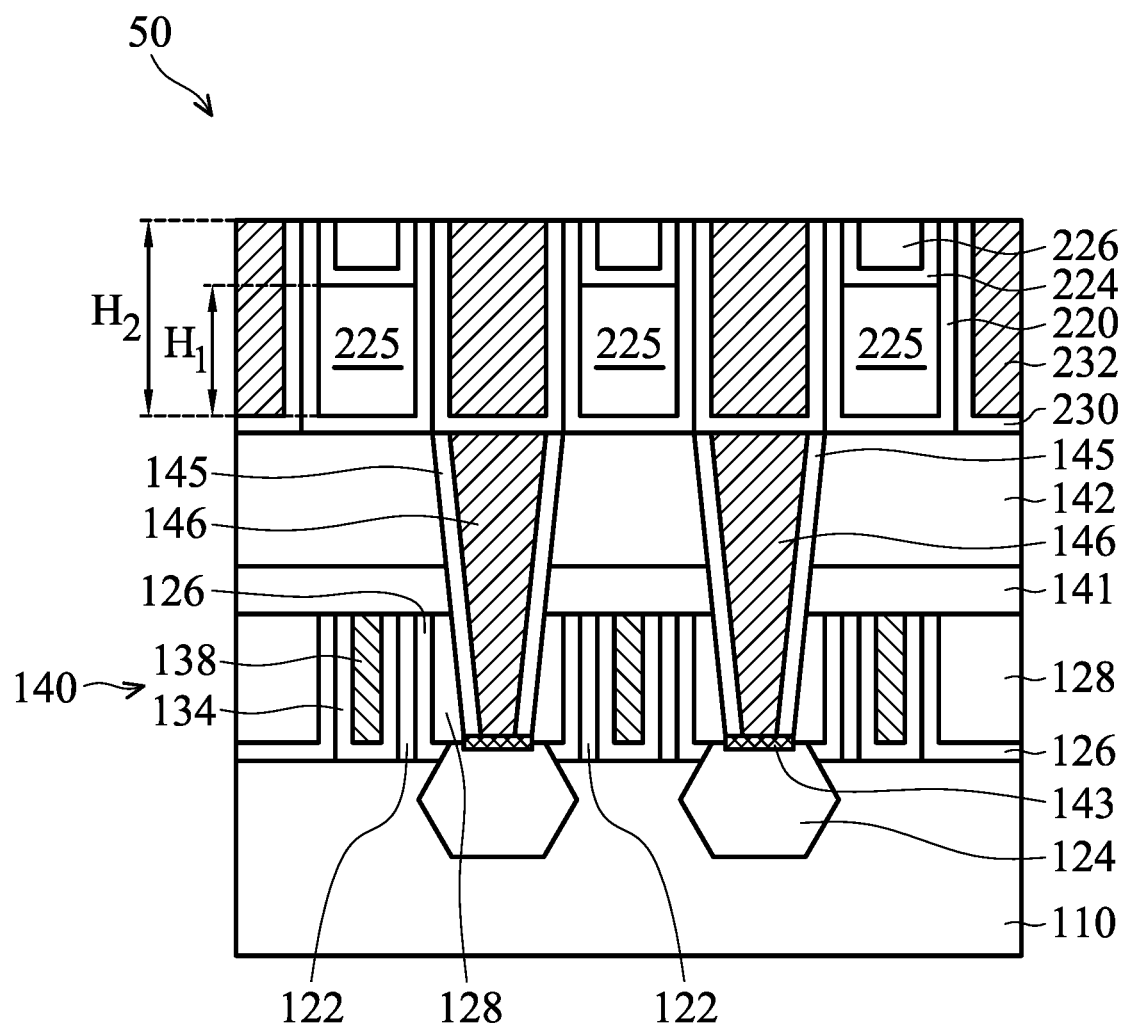
Figure 2L:
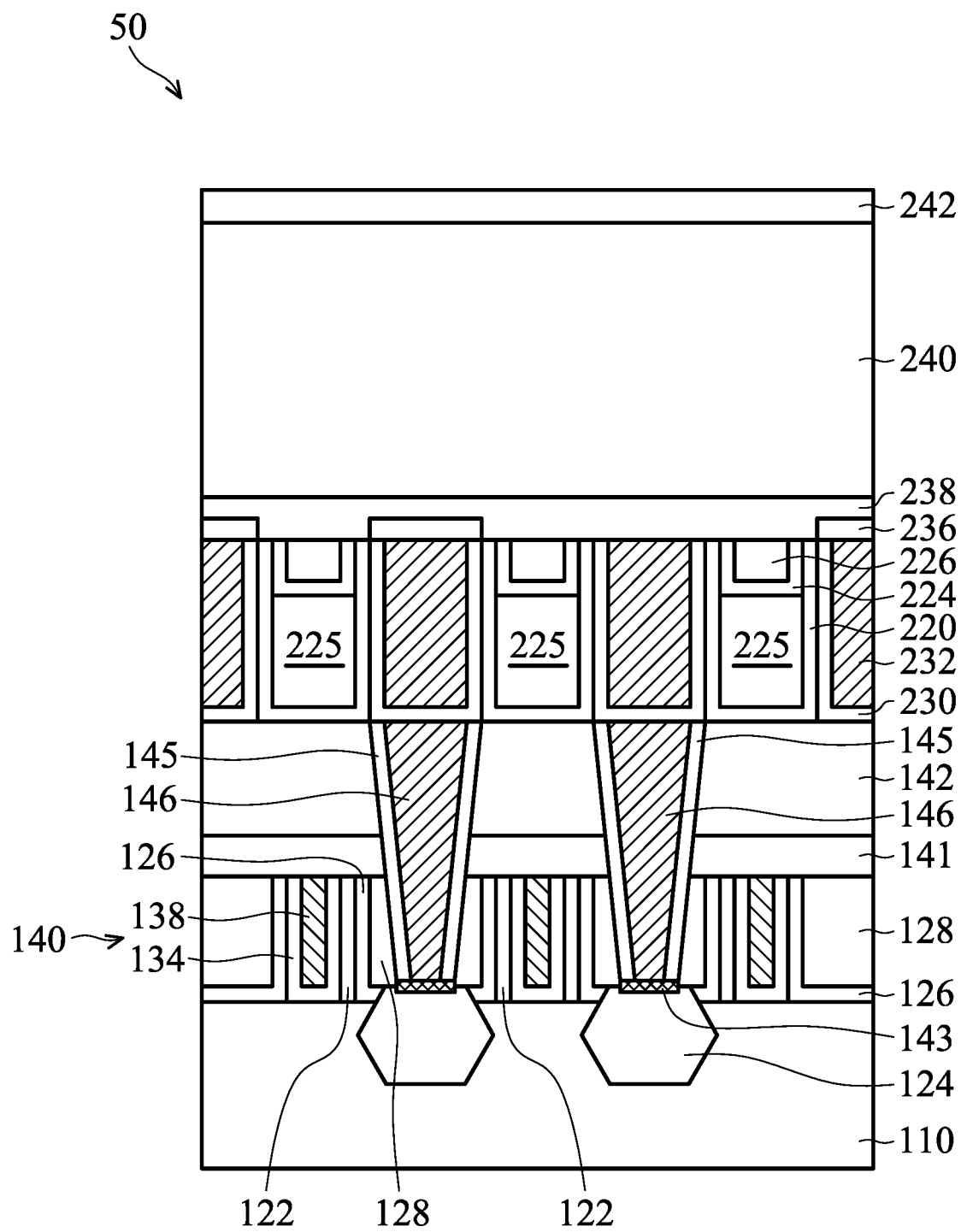
Figure 2M:
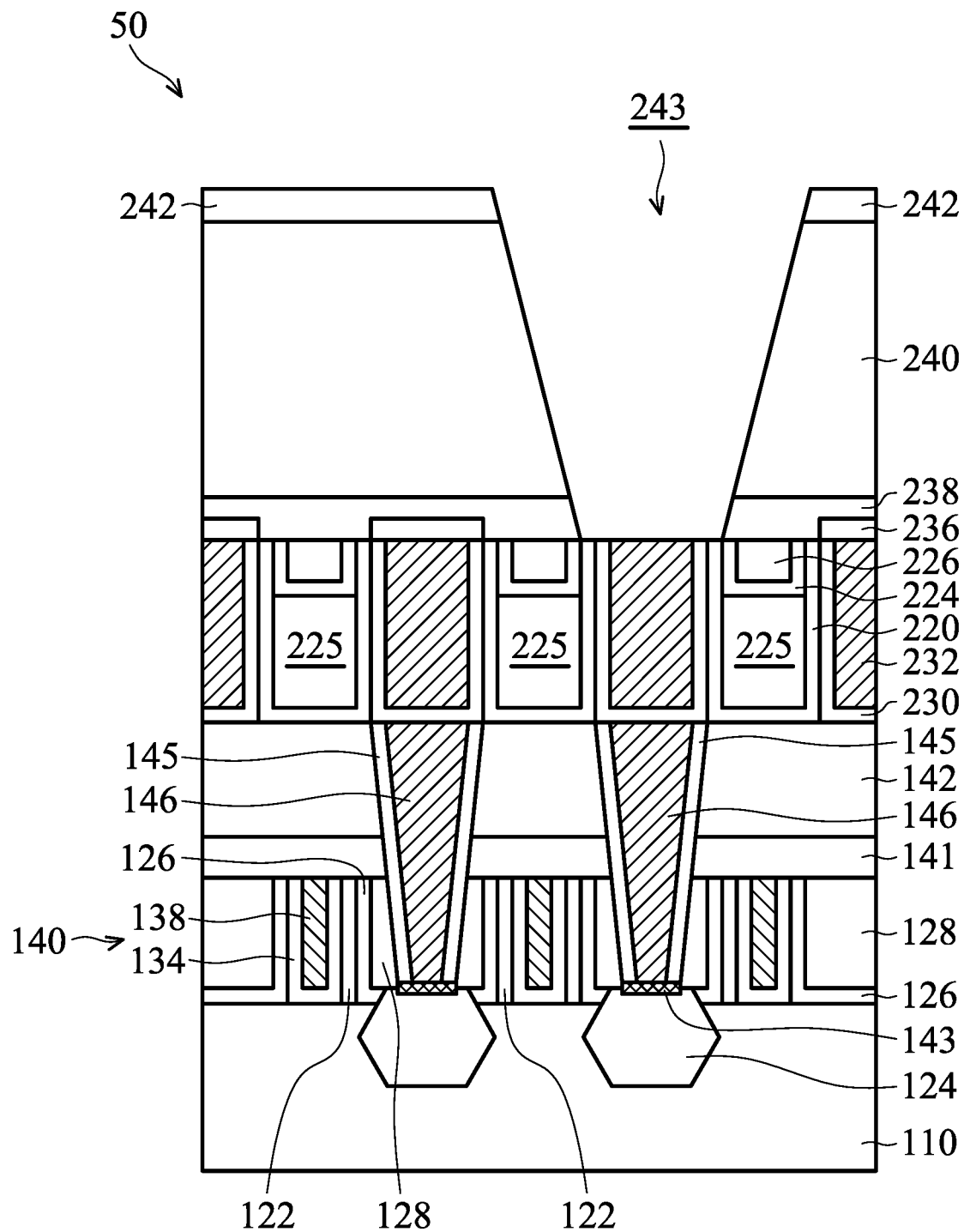
Figure 2N:
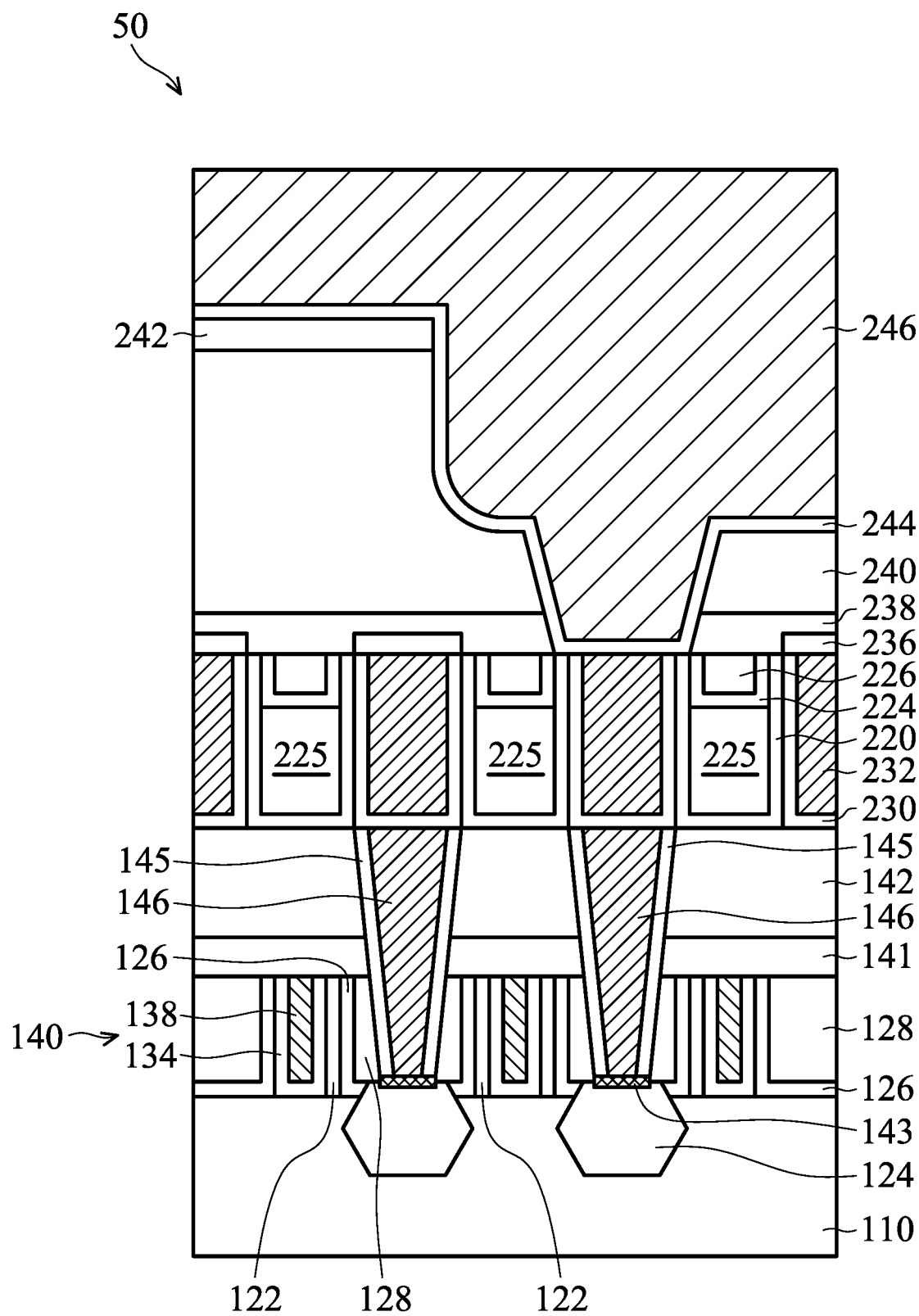
Figure 2O:
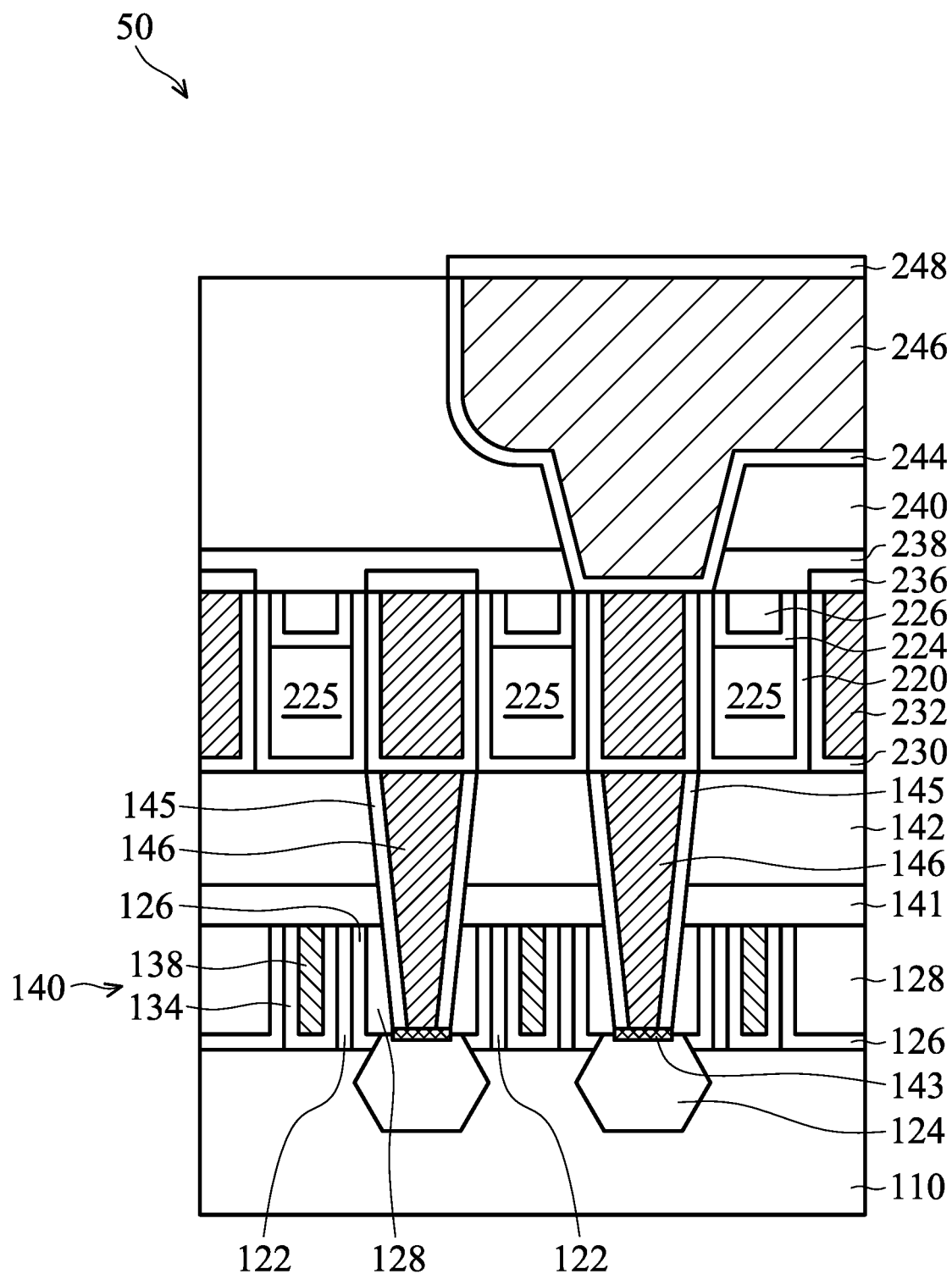

FIGS. 2A-2O show cross-sectional representations of various stages of forming a semiconductor device structure after FIG. 1A, in accordance with some embodiments of the disclosure. An interconnect structure 50 is formed over the dielectric layer 142. The interconnect structure 50 is formed in a back-end-of-line (BEOL) process.

As shown in FIG. 2A, a first etch stop layer 210 is formed over the dielectric layer 142 and the SID contact structure 146. The first etch stop layer 210 may be a single layer or multiple layers. The first etch stop layer 210 protects the underlying layers, such as the dielectric layer 142 and also provides improved adhesion for layers formed subsequently.

The first etch stop layer 210 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the first etch stop layer 210 is formed by plasma enhanced CVD, low-pressure CVD, atomic layer deposition (ALD), or other applicable processes.

A first hard mask layer 212 is formed over the first etch stop layer 210. The first hard mask layer 212 may be a single layer or multiple layers. In some embodiments, the first hard mask layer 212 is made of titanium nitride (TiN), tantalum nitride (TaN), tungsten nitride (WN), or another applicable material. In some embodiments, the first hard mask layer 212 is formed by a deposition processes, such as a chemical vapor deposition (CVD) process, a high-density plasma chemical vapor deposition (HDPCVD) process, a physical vapor deposition (PVD) process, a spin-on process, a sputtering process, atomic layer deposition (ALD), or another applicable process.

A second hard mask layer 214 is formed over the first hard mask layer 212, and afterwards, the second hard mask layer 214 is patterned to form an patterned second hard mask layer 214. The first hard mask layer 212 and the second hard mask layer 214 are made of different materials. Therefore, the first hard mask layer 212 and the second hard mask layer 214 have different etching selectivity. In some embodiments, the second hard mask layer 214 is made of SiCO, SiCN, SiN, SiCON, SiOx, SiC, SiON or another applicable material.

Afterwards, as shown in FIG. 2B, the first hard mask layer 212 is patterned to form an patterned first hard mask layer 212 by using the second hard mask layer 214 as a mask, and then the first etch stop layer 210 is patterned to form an patterned first etch stop layer 210, in accordance with some embodiments of the disclosure. As a result, a number of trenches 217 are formed to expose the top surface of the dielectric layer 142. It should be noted that the S/D contact structure 146 is not exposed and is covered by the first etch stop layer 210.

Next, as shown in FIG. 2C, a capping layer 220 is conformally formed in the trench 217 and on the exposed dielectric layer 142, in accordance with some embodiments of the disclosure. The top surface of the patterned second hard mask 214 and the sidewall surfaces of the pattered first hard mask layer 212 are covered by the capping layer 220. The capping layer 220 is used to as an etch stop layer to protect the underlying layers. In some embodiments, the capping layer 220 has a U-shaped structure.

In some embodiments, the capping layer 220 is made of Si-based material (SiCO, SiCN, SiN, SiCON, SiOx, SiC, SiON), Al-based material (AlNx, AlON, AlOx, or another applicable material. In some embodiments, the capping layer 220 is a formed by a deposition processes, such as a chemical vapor deposition (CVD) process, a plasma enhanced chemical vapor deposition (PECVD) process, a physical vapor deposition (PVD) process, a spin-on process, a sputtering process, an atomic layer deposition (ALD), a plasma enhanced atomic layer deposition (PEALD) or another applicable process. In some embodiments, the capping layer 220 has a thickness in a range from about 5 angstrom to 200 angstrom.

Afterwards, as shown in FIG. 2D, a sacrificial layer 222 is formed in the trench 217 and over the capping layer 220, in accordance with some embodiments of the disclosure. In some embodiments, the sacrificial layer 222 is made of an organic material, such as a polymer composed of C, O, N, H. The sacrificial layer 222 is made of flowable material. Since the sacrificial layer 222 is made of flowable material, the gap filling ability is better to make sure the trench 217 is filled with the sacrificial layer 222.

In some embodiments, the sacrificial layer 222 is formed by a deposition processes, such as a chemical vapor deposition (CVD) process, a plasma enhanced chemical vapor deposition (PECVD) process, a physical vapor deposition (PVD) process, a spin-on process, a sputtering process, an atomic layer deposition (ALD), a plasma enhanced atomic layer deposition (PEALD) or another applicable process. In some embodiments, the sacrificial layer 222 has a thickness in a range from about 10 angstrom to 1000 angstrom.

Afterwards, as shown in FIG. 2E, a top portion of the sacrificial layer 222 is removed, in accordance with some embodiments of the disclosure. As a result, a recess 223 is formed over the remaining bottom portion of the sacrificial layer 222. The top surface of the bottom portion of the sacrificial layer 222 is lower than the top surface of the patterned second hard mask layer 214. The top surface of the bottom portion of the sacrificial layer 222 is lower than the top surface of the capping layer 220. In addition, the top surface of the capping layer 220 and a portion of the sidewall surfaces of the capping layer 220 are exposed.

The height of the sacrificial layer 222 can be adjusted by a thermal process or an etching back process. The thermal process may be a thermal baking process or an UV curing process. In some embodiments, the portion of the sacrificial layer 222 is removed by a thermal baking process, and the thermal baking process is operated at a temperature in a range from about 200 Celsius degrees to about 400 Celsius degrees. In some embodiments, the portion of the sacrificial layer 222 is removed by an etching back process, and the etching back process is operated at a temperature in a range from about room temperature to about 150 Celsius degrees.

Next, as shown in FIG. 2F, a support layer 224 is formed over the recess 223 and is conformally formed on the capping layer 220, and then the remaining bottom portion of the sacrificial layer 222 is removed to form an air gap structure 225, in accordance with some embodiments of the disclosure. As a result, the top surface of the air gap structure 225 is lower than the top surface of the capping layer 220.

The support layer 224 is used to provide a mechanical strength to protecting the air gap structure 225. Furthermore, the sealing of the air gap structure 225 by the support layer 224 may prevent the air gap structure 225 from being re-opened during subsequent processes. In some embodiments, the support layer 224 has a U-shaped structure. The U-shaped support layer 224 has two vertical portions and a horizontal portion connecting the two vertical portions. The two vertical portions are in direct contact with the capping layer 220, and the horizontal portion is in direct contact with the air gap structure 225.

It should be noted that the air gap structure 225 is surrounded by the capping layer 220 and the support layer 224. Even the sacrificial layer 222 is removed, the positions of the capping layer 220 and the support layer 224 are not changed. The air gap structure 225 has a low dielectric constant (e.g. 1), and therefore the parasitic capacitance between the first conductive layers 232 (formed later, as shown in FIG. 2J) in the interconnect structure 50 is reduced. In addition, by forming the air gap structure 225 in the interconnect structure 50, the reliability of the interconnect structure 50 is improved.

In some embodiments, the support layer 224 is made of porous SiO, SiCO, SiNO, SiCN, SiCON or another applicable material. In some embodiments, the support layer 214 is formed by a deposition processes, such as a chemical vapor deposition (CVD) process, a plasma enhanced chemical vapor deposition (PECVD) process, a physical vapor deposition (PVD) process, a spin-on process, a sputtering process, an atomic layer deposition (ALD), a plasma enhanced atomic layer deposition (PEALD) or another applicable process. In some embodiments, the support layer 224 has a thickness in a range from about 2 angstrom to 100 angstrom.

In some embodiments, the remaining bottom portion of the sacrificial layer 222 is removed by a thermal process or an etching back process. The thermal process may be a thermal baking process or an UV curing process.

Afterwards, as shown in FIG. 2G, a filling layer 226 is formed over the support layer 224, in accordance with some embodiments of the disclosure. More specifically, the filing layer 226 is formed on the horizontal portion of the U-shaped structure of the support layer 224. The recess 223 is filled with the support layer 224 and the filling layer 226.

In some embodiments, the filling layer 226 is made of Si-based material (SiCO, SiCN, SiN, SiCON, SiOx, SiC, SiON), low-k material (SiCOH, dielectric constant around 2.0 to 3.6), or anther applicable material. It should be noted that the filling layer 226 has a porosity in a range from about 40% to about 0.1%. When the porosity of the filling layer 226 is in above-mentioned range, the dielectric constant of the filling layer 226 is reduced, and therefore the parasitic capacitance of the interconnect structure 50 is reduced. In addition, the filling layer 226 has a dielectric constant less than about 4 (e.g., 3.6) to reduce the impact on the parasitic capacitance.

In some embodiments, the filling layer 226 is formed by a deposition processes, such as a chemical vapor deposition (CVD) process, a plasma enhanced chemical vapor deposition (PECVD) process, a physical vapor deposition (PVD) process, a spin-on process, a sputtering process, an atomic layer deposition (ALD), a plasma enhanced atomic layer deposition (PEALD) or another applicable process. In some embodiments, the filling layer 226 has a thickness in a range from about 2 angstrom to 1000 angstrom.

Next, as shown in FIG. 2H, a portion of the filling layer 226, the second hard mask layer 214 and a portion of the capping layer 220 and a portion of the support layer 224 are removed, in accordance with some embodiments of the disclosure. In some embodiments, the portion of the filling layer 226, the hard mask layer 214 and a portion of the capping layer 220 and a portion of the support layer 224 are removed by a chemical mechanical polishing (CMP) process. As a result, the top surface of the filling layer 226 is substantially leveled with the top surface of the support layer 224 and the top surface of the capping layer 220.

Afterwards, as shown in FIG. 2I, the first hard mask layer 212 and the first etch stop layer 210 are removed to form an opening 229, in accordance with some embodiments of the disclosure. As a result, the top surface of the SID contact structure 146 is exposed. In some embodiments, the portion of the first hard mask layer 212 and the first etch stop layer 210 are removed by an etching process, such as a wet etching process or a dry etching process.

The capping layer 220 and the support layer 224 are configured to provide a high etch selectivity relative to the first hard mask layer 212 and the first etch stop layer 210 during the etching process. Therefore, the first hard mask layer 212 and the first etch stop layer 210 are removed, but the capping layer 220 and the support layer 224 are remaining.

Next, as shown in FIG. 2J, a first barrier layer 230 and a first conductive layer 232 are sequentially formed in the opening 229, in accordance with some embodiments of the disclosure. As a result, the top surface of the air gap structure 225 is lower than the top surface of the first conductive layer 232.

In some embodiments, the first barrier layer 230 is made of Ta, TaN, Ti, TiN, or CoW. In some embodiments, the first barrier layer 230 is formed by a physically vapor deposition (PVD) process, an atomic layer deposition (ALD) process, or another applicable process. In some embodiments, the first conductive layer 232 is made of aluminum (Al), copper (Cu), tungsten (W), titanium (Ti), tantalum (Ta), or other applicable materials. In some embodiments, the first conductive layer 232 is formed by a deposition process, such as a chemical vapor deposition (CVD) process, physical vapor deposition (PVD) process, atomic layer deposition (ALD) process, plating process or another application process.

Next, as shown in FIG. 2K, a portion of the first barrier layer 230 and a portion of the first conductive layer 232 are removed to expose the top surface of the filling layer 226, in accordance with some embodiments of the disclosure. In addition, the top surfaces of the support layer 224 and the capping layer 220 are exposed. In some embodiments, the portion of the first barrier layer 230 and the portion of the first conductive layer 232 are removed by a chemical mechanical polishing (CMP) process.

The air gap structure 225 has a first height $H_1$ from the bottom surface to the top surface of the air gap structure 225. The bottom surface of the air gap structure 225 is in direct contact with the capping layer 220, and the top surface of the air gap structure 225 is in direct contact with the support layer 224. The conductive layer 232 has a second height $H_2$. In some embodiments, a ratio of the first height $H_1$ to the second height $H_2$ is in a range from about 5% to about 90%. If the ratio is lower than 5%, the parasitic capacitance between adjacent first conductive layers 232 may be too high. If the ratio is higher than 90%, there would be via punch concern during next layer via landing.

Afterwards, as shown in FIG. 2L, a conductive capping layer 236 is formed over the first conductive layer 232, in accordance with some embodiments of the disclosure. Next, a second etch stop layer 238 is formed over the conductive capping layer 236, the filling layer 226, the support layer 224 and the capping layer 220. A second dielectric layer 240 is formed over the second etch stop layer 238, and a third hard mask layer 242 is formed over the second dielectric layer 240. The second etch stop layer 238 is in direct contact with the conductive capping layer 236, the filling layer 226, the support layer 224 and the capping layer 220.

The conductive capping layer 236 can be used as a protective layer for preventing the surface of the first conductive layer 232 from being oxidized. It should be noted that the conductive capping layer 236 is selectively formed on conductive material, and therefore the conductive capping layer 236 is formed on the first conductive layer 232, not formed on the capping layer 220. The top surface of the conductive capping layer 236 is higher than the top surface of the support layer 224. In some embodiments, the conductive capping layer 236 is formed on the first barrier layer 230 and the first conductive layer 232. In some other embodiments, the conductive capping layer 236 is formed on the first conductive layer 232, but not formed on the first barrier layer 230.

In some embodiments, the conductive capping layer 236 is made of metal material, such as Cu, Co, Ru, Mo, Cr, W, Mn, Rh, Ir, Ni, Pd, Pt, Ag, Au, Al, or another applicable materials. In some embodiments, the conductive capping layer 236 is formed by a deposition process, such as a chemical vapor deposition (CVD) process, physical vapor deposition (PVD) process, atomic layer deposition (ALD) process, plating process or another application process. In some embodiments, the conductive capping layer 236 has a thickness in a range from about 2 angstrom to 50 angstrom.

Afterwards, as shown in FIG. 2M, a portion of the third hard mask layer 242, a portion of the second dielectric layer 240, a portion of the second etch stop layer 238, and a portion of the conductive capping layer 236 are removed to form a trench 243, in accordance with some embodiments of the disclosure. As a result, the top surface of the first conductive layer 232 is exposed. In some embodiments, the portion of the second etch stop layer 238, and the portion of the conductive capping layer 236 are removed by an etching process, and the etching process includes multiple etching steps.

Next, as shown in FIG. 2N, a second barrier layer 244 and a second conductive layer 246 are sequentially formed in the trench 243, in accordance with some embodiments of the disclosure. The second conductive layer 246 is electrically connected to the first conductive layer 232. In some embodiments, a portion of the second conductive layer 246 is directly over the air gap structure 225.

Afterwards, as shown in FIG. 2O, a portion of the second barrier layer 244, a portion of the second conductive layer 246, and the third hard mask layer 242 are removed, in accordance with some embodiments of the disclosure. In some embodiments, the portion of the second barrier layer 244, a portion of the second conductive layer 246, and the third hard mask layer 242 are removed by a chemical mechanical polishing (CMP) process. Next, a second conductive capping layer 248 is formed on the second conductive layer 246.

It should be noted that the parasitic capacitance between two adjacent conductive layers, such as the first conductive layer 232, is reduced by formation of the air gap structure 225. Furthermore, the sealing of the air gap structure 225 by the support layer 224 may prevent the air gap structure 225 from being re-opened during subsequent processes.

Embodiments for forming a semiconductor device structure and method for formation the same are provided. The semiconductor device structure includes a FinFET structure or a GAA structure formed over a substrate, and an interconnect structure formed over the FinFET structure. The interconnect structure includes an air gap structure adjacent to the conductive layer. Since the air gap structure has a low dielectric constant, and therefore the parasitic capacitance in the interconnect structure is reduced. In addition, by forming the air gap structure in the interconnect structure, the reliability of the interconnect structure is improved. Furthermore, the performance of the semiconductor device structure is improved.

In some embodiments, a semiconductor device structure is provided. The semiconductor device structure includes a first conductive layer formed over a substrate, and an air gap structure adjacent to the first conductive layer. The semiconductor device structure includes a support layer formed over the air gap structure. A bottom surface of the support layer is in direct contact with the air gap structure, and the bottom surface of the support layer is lower than a top surface of the first conductive layer and higher than a bottom surface of the first conductive layer.

In some embodiments, a semiconductor device structure is provided. The semiconductor device structure includes a gate structure formed over a substrate, and a first dielectric layer formed over the gate structure. The semiconductor device structure also includes an air gap structure formed over the first dielectric layer, and a capping layer surrounding the air gap structure. The semiconductor device structure includes a support layer formed over the air gap structure, and the air gap structure is surrounded by the capping layer and the support layer.

In some embodiments, a method for forming a semiconductor device structure is provided. The method includes forming a gate structure over a substrate, and forming a first dielectric layer over the gate structure. The method includes forming a hard mask layer over the first dielectric layer, and removing a portion of the hard mask layer to form a trench. The method also includes forming a capping layer in the trench, and forming a sacrificial layer in the trench and on the capping layer. The method also includes removing a top portion of the sacrificial layer, and forming a support layer on the bottom portion of the sacrificial layer. The method further includes removing the bottom portion of the sacrificial layer to form an air gap structure, and the air gap structure is surrounded by the capping layer and the support layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first conductive layer formed over a substrate;
   an air gap structure adjacent to the first conductive layer; and
   a support layer formed over the air gap structure, wherein a bottom surface of the support layer is in direct contact with the air gap structure, and the bottom surface of the support layer is lower than a top surface of the first conductive layer and higher than a bottom surface of the first conductive layer, wherein an entirety of the support layer is formed on a top surface of the air gap structure; and
   a filling layer formed over the support layer, wherein the air gap structure is separated from the filling layer by the support layer.

2. The semiconductor device structure as claimed in claim 1, further comprising:
   a capping layer surrounding the air gap structure, wherein the capping layer is between the air gap structure and the first conductive layer.

3. The semiconductor device structure as claimed in claim 1, further comprising:
   a second conductive layer formed over the first conducive layer, wherein the second conductive layer is formed over the air gap structure.

4. The semiconductor device structure as claimed in claim 1, further comprising:
   a conductive capping layer formed over the first conductive layer, wherein a top surface of the conductive capping layer is higher than a top surface of the support layer.

5. The semiconductor device structure as claimed in claim 1, wherein the support layer has a U-shaped structure with two vertical portions and a horizontal portion between the two vertical portions.

6. The semiconductor device structure as claimed in claim 1, further comprising:
   an etch stop layer formed over the support layer, wherein the etch stop layer is in direct contact with the support layer.

7. The semiconductor device structure as claimed in claim 1, further comprising:
   a fin structure formed over the substrate;
   a gate structure formed over the fin structure; and
   the first conductive layer formed over the gate structure.

8. The semiconductor device structure as claimed in claim 1, further comprising:
   a plurality of nanostructures formed over the substrate;
   a gate structure formed over the nanostructures; and
   the first conductive layer formed over the gate structure.

9. The semiconductor device structure as claimed in claim 1, further comprising:
   a second conductive layer formed on the first conductive layer, wherein a portion of the second conductive layer is directly over the air gap structure.

10. A semiconductor device structure, comprising:
    a gate structure formed over a substrate;
    a first dielectric layer formed over the gate structure;
    an air gap structure formed over the first dielectric layer;
    a capping layer surrounding the air gap structure; and
    a support layer formed over the air gap structure, wherein the air gap structure is surrounded by the capping layer and the support layer, and a topmost surface of the air gap structure is in direct contact with a bottommost surface of the support layer, and the air gap structure is directly over the gate structure.

11. The semiconductor device structure as claimed in claim 10, further comprising:
    a filling layer formed over a horizontal portion of the support layer.

12. The semiconductor device structure as claimed in claim 10, further comprising:
    a first conductive layer adjacent to the air gap structure, wherein the capping layer is between the air gap structure and the first conductive layer.

13. The semiconductor device structure as claimed in claim 12, further comprising:
    a conductive capping layer formed over the first conductive layer, wherein a top surface of the conductive capping layer is higher than a top surface of the support layer.

14. The semiconductor device structure as claimed in claim 12, wherein a top surface of the air gap structure is lower than a top surface of the first conductive layer.

15. The semiconductor device structure as claimed in claim 12, further comprising:
    a plurality of nanostructures formed over the substrate;
    a gate structure formed over the nanostructures; and
    the first conductive layer formed over the gate structure.

16. A method for forming a semiconductor device structure, comprising:
    forming a gate structure over a substrate;
    forming a first dielectric layer over the gate structure;
    forming a hard mask layer over the first dielectric layer;
    removing a portion of the hard mask layer to form a trench;
    forming a capping layer in the trench;
    forming a sacrificial layer in the trench and on the capping layer;
    removing a top portion of the sacrificial layer to form a remaining sacrificial layer;
    forming a support layer on a top surface of the remaining sacrificial layer; and
    removing the remaining sacrificial layer to form an air gap structure, wherein the air gap structure is surrounded by the capping layer and the support layer, and wherein a top surface of the capping layer is higher than a topmost surface of the air gap structure.

17. The method for forming the semiconductor device structure as claimed in claim 16, further comprising:
    forming a filling layer over the support layer.

18. The method for forming the semiconductor device structure as claimed in claim 16, further comprising:
    removing the hard mask layer to form an opening; and
    forming a conductive layer in the opening.

19. The method for forming the semiconductor device structure as claimed in claim 18, further comprising:
    forming a conductive capping layer over the conductive layer.

20. The method for forming the semiconductor device structure as claimed in claim 16, wherein the top surface of the remaining sacrificial layer is lower than a top surface of the capping layer.

\* \* \* \* \*